(12) United States Patent
Diest et al.

(10) Patent No.: US 12,270,989 B2
(45) Date of Patent: Apr. 8, 2025

(54) STIFFENING STRUCTURES FOR MICRO-ELECTRO-MECHANICAL SYSTEM (MEMS) MICROMIRRORS

(71) Applicant: Meta Platforms Technologies, LLC, Menlo Park, CA (US)

(72) Inventors: Kenneth Alexander Diest, Kirkland, WA (US); Katherine Marie Smyth, Seattle, WA (US); Daniel Guenther Greif, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 528 days.

(21) Appl. No.: 17/682,800

(22) Filed: Feb. 28, 2022

(65) Prior Publication Data

US 2023/0273424 A1 Aug. 31, 2023

(51) Int. Cl.
*G02B 26/08* (2006.01)
*B81B 3/00* (2006.01)
*B81C 1/00* (2006.01)
*G02B 26/10* (2006.01)

(52) U.S. Cl.
CPC .......... *G02B 26/0833* (2013.01); *B81B 3/007* (2013.01); *B81C 1/00658* (2013.01); *G02B 26/101* (2013.01); *B81B 2201/042* (2013.01)

(58) Field of Classification Search
CPC .. G02B 26/0833; G02B 26/101; B81B 3/007; B81B 2201/042; B81C 1/00658
See application file for complete search history.

(56) References Cited

U.S. PATENT DOCUMENTS

| | | |
|---|---|---|
| 9,910,269 B2 | 3/2018 | Van Lierop |
| 2005/0139542 A1 | 6/2005 | Dickensheets et al. |
| 2011/0149361 A1* | 6/2011 | Moidu ............... G02B 26/0841 29/622 |
| 2021/0255373 A1 | 8/2021 | Yasumura |

OTHER PUBLICATIONS

Hofmann U., et al., "Resonant Biaxial 7-mm MEMS Mirror for Omnidirectional Scanning," Journal of Micro/Nanolithography, MEMS, and MOEMS, 2014, vol. 13, No. 1, 13 pages.
Ji C.H., et al., "An Electrostatic Scanning Micromirror with Diaphragm Mirror Plate and Diamond-Shaped Reinforcement Frame," Journal of Micromechanics and Microengineering, Apr. 7, 2006, pp. 1033-1039.
Lutzenberger B.J., "Analysis and Design of MEMS Scan Mirrors Using Periodically Stiffened Silicon Nitride," Montana State University, Apr. 2006, 147 pages.

(Continued)

*Primary Examiner* — Euncha P Cherry
(74) *Attorney, Agent, or Firm* — Freestone Intellectual Property Law PLLC; Aaron J. Visbeek

(57) ABSTRACT

An apparatus, system, and method for micro-electro-mechanical system (MEMS) micromirror including a plurality of stiffening structures is described. The MEMS micromirror includes a mirror surface to reflect light, a support platform coupled along a mirror surface, and a plurality of stiffening structures formed from or coupled to the support platform. In some examples, a dimensionality or density of the stiffening structures scale across an area of the support platform in a manner to assist in keeping the mirror surface flat under torsional force.

18 Claims, 7 Drawing Sheets

(56) References Cited

OTHER PUBLICATIONS

Milanovic V., et al., "Gimbal-Less Monolithic Silicon Actuators for Tip-Tilt-Piston Micromirror Applications," IEEE Journal of Selected Topics in Quantum Electronics, 2004, vol. 10, No. 3, pp. 462-471.
Su J.G., et al., "Surface-Micromachined 2D Optical Scanners with Optically Flat Single-Crystalline Silicon Micromirrors," Proceedings of Society of Photo-Optical Instrumentation Engineers (SPIE), 2001, vol. 4293, pp. 46-53.
International Search Report and Written Opinion for International Application No. PCT/US2023/013906, mailed Jun. 22, 2023, 9 pages.

* cited by examiner

STIFFENING STRUCTURES FOR MICRO-ELECTRO-MECHANICAL SYSTEM (MEMS) MICROMIRRORS

TECHNICAL FIELD

This disclosure relates generally to optical micro-electro-mechanical (MEMS) devices, and in particular but not exclusively to micromirrors for optical MEMS devices.

BACKGROUND INFORMATION

MEMS micromirrors are micro or nano-scale mirrors that reflect light. They may be used in various optical applications, such as where an optical beam from a light source is reflected from the mirror and swept across a region in free space. The MEMS micromirrors may be static, translated, or rotated along one or more axes. Applications may be related to, but are not limited to, augmented reality/virtual reality (AR/VR), 3D-imaging, light detection and ranging (LIDAR), telecommunications, and other switching, imaging, and beam steering applications.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a micro-electro-mechanical system (MEMS) micromirror including a plurality of stiffening structures to assist in maintaining or keeping the MEMS micromirror flat under torsional force are described herein. In aspects, the plurality of stiffening structures is formed from or coupled to a support substrate or platform. In various embodiments, a dimensionality or density of the stiffening structures scale across an area of the support platform in a hierarchical manner.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As mentioned above, MEMS micromirrors are used in various optical applications, in which an optical beam from a light source is reflected from a mirror and swept across a region in free space. In some applications, as a mirror oscillates, the mirror experiences increased stress and deformation across its structure due to torsional forces experienced at operating frequencies. The torsional forces distort the optical flatness and uniformity of the mirror and may limit the mirror's performance as an optical device. A common approach to addressing this problem is to manufacture a thicker mirror. Unfortunately, increased mass and volume may also increase stress on the mirror. The resulting stress, such as but not limited to, e.g., torsional stresses, can lead to problems, such as decreased operational lifetime, and/or immediate failure of the device.

Accordingly, an apparatus, system, and method for stiffening structures for MEMS micromirrors include a plurality of stiffening structures that scale across an area of a support platform in a manner to assist in keeping a micromirror surface optically flat. In aspects, a dimensionality or density of the stiffening structures scale across an area of the support platform in a hierarchical manner to modify mechanical properties of the micromirror. These and other embodiments are described in more detail in connection with FIGS. 1-7.

Figure 1:
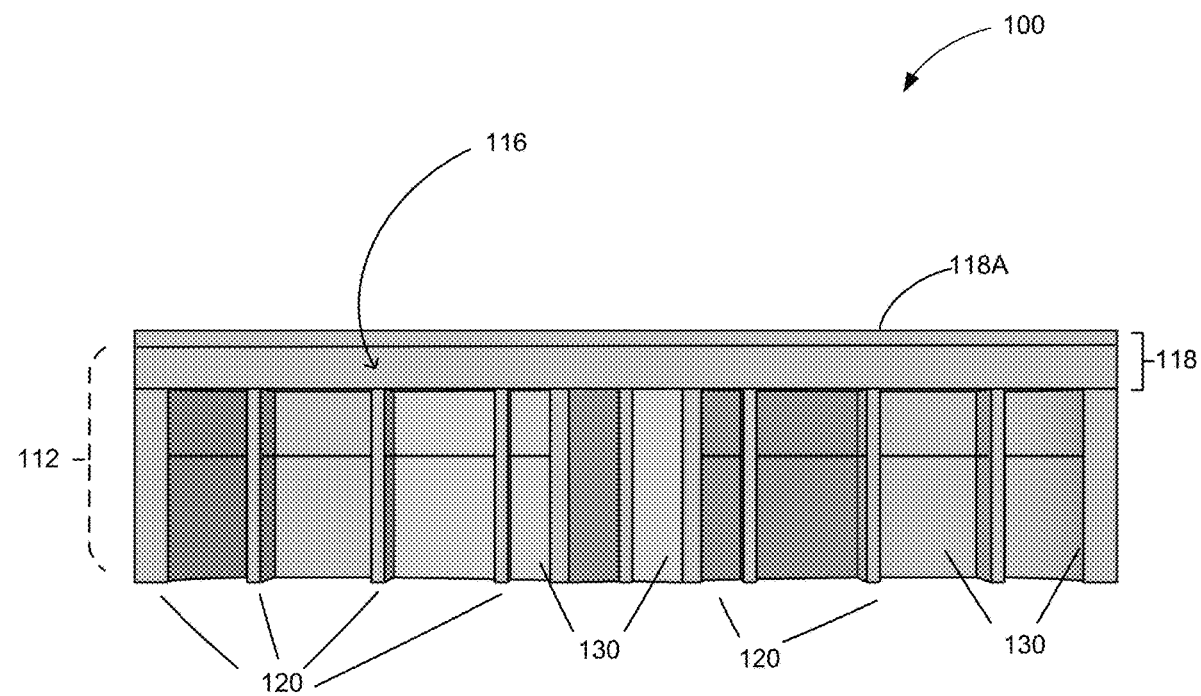
FIG. 1 illustrates a side view of a micromirror including a plurality of stiffening structures, in accordance with aspects of the disclosure.

FIG. 1 illustrates a side view of a MEMS micromirror 100 including a plurality of stiffening structures, in accordance with aspects of the disclosure. As shown, MEMS micromirror 100 includes a mirror surface 118A formed over a support substrate ("support platform 112"). In aspects, mirror surface 118A includes a reflective layer formed over support platform 112 and is included in a mirror element 118. As shown, each of the plurality of stiffening structures 120 may include a height that extends in a perpendicular manner from support platform 112. In aspects, a plurality of stiffening structures 120 are formed from or coupled to support platform 112 across an area 116 of support platform 112.

In aspects, open areas 130 exist between each of the plurality of stiffening structures and represent portions of mirror element 118 that are not immediately supported with one or more stiffening structures 120. Note that only a few of stiffening structures 120 and open areas 130 have been labeled in FIG. 1 to avoid obscuring the drawing. Note that in some aspects (not shown), a void extends through the reflective layer and support platform 112. As will be shown in further detail with respect to FIGS. 2-7, a dimensionality or density of the stiffening structures scales across a surface or area (e.g., area 116 of support platform 112) in a manner to assist in keeping the micromirror surface flat or optically flat under torsional force.

As will be shown in the below FIGS, a dimensionality of the stiffening structures may scale hierarchically across an area of the support platform. In some aspects, hierarchical may refer to a property of pattern or shapes, where stiffening structures with a given or first dimensionality are inset within one or more additional stiffening structures having a different or second dimensionality.

Figure 2:
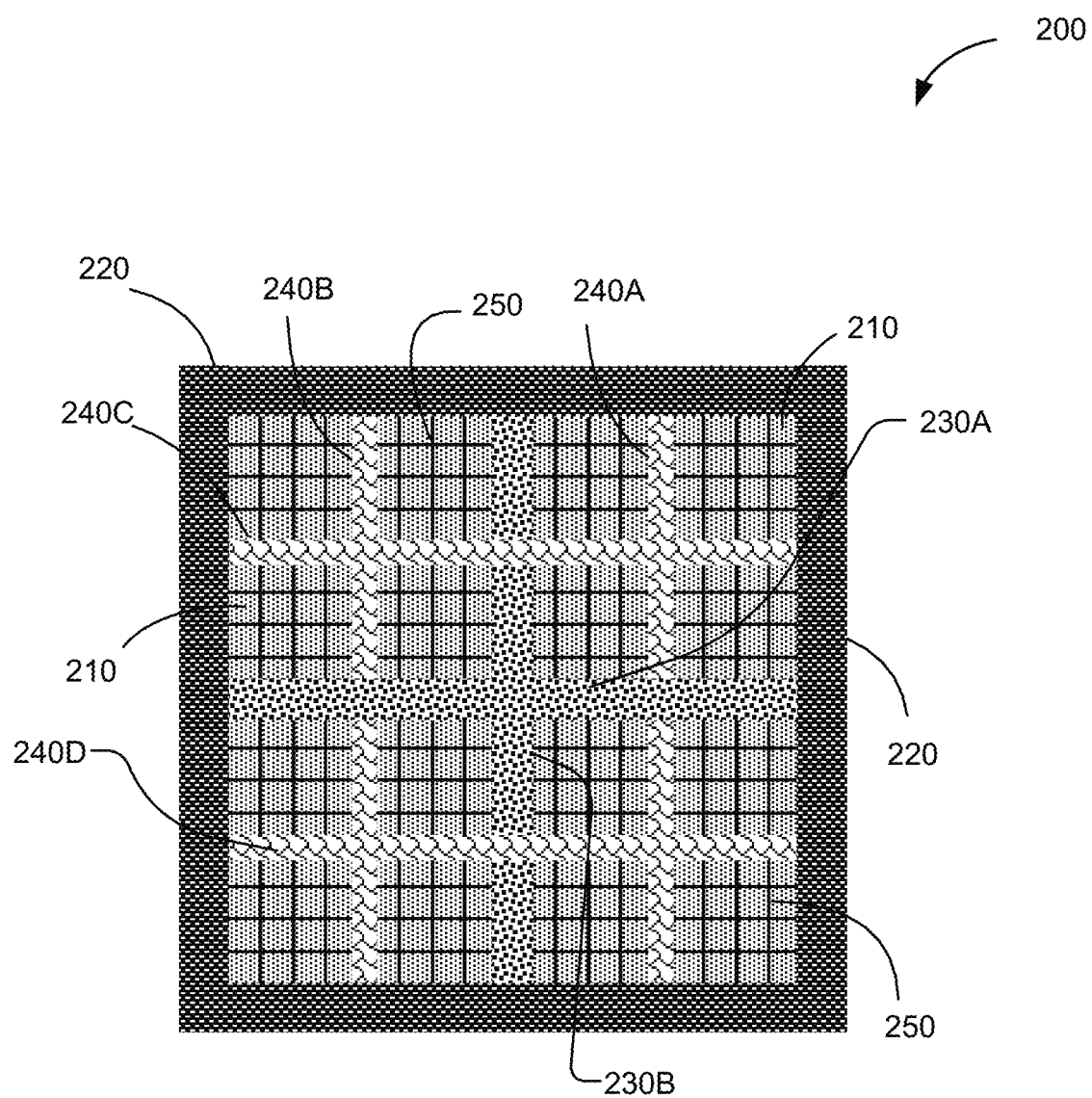
FIG. 2 illustrates a bottom view of a square micromirror including a plurality of stiffening structures, in accordance with aspects of the disclosure.

FIG. 2 illustrates a bottom view of a square micromirror 200 including a plurality of stiffening structures, in accordance with aspects of the disclosure. In the example of FIG. 2, a dimensionality of each of a plurality of stiffening structures scale hierarchically relative to a density of the stiffening structures. In the example, a plurality of stiffening structures forms a grid structure. In aspects, the stiffening structures form beams that extend down from a bottom area micromirror 200 to achieve a desired height (discussed further in connection with FIG. 5). As shown, micromirror 200 includes primary stiffening structures 230A and 230B, secondary stiffening structures 240A-240D, tertiary stiffening structures 250, and a perimeter stiffening structure 220. Note that only a few of tertiary stiffening structures 250 have been labeled to avoid obscuring FIG. 2.

In the example of FIG. 2, dimensionality (including for example, length and thickness) of the stiffening structures scales inversely with their density across an area (or area of a support platform, e.g., 116 of FIG. 1) of micromirror 200. For example, the stiffening structures have a dimensionality that decreases with their relative density in the area of micromirror 200. In embodiments, density may refer to a number of stiffening structures per unit area of a support platform coupled to or including a mirror surface. In the example, the density of tertiary stiffening structures 250 is high, while their width or thickness is relatively low, while the opposite may be true for primary stiffening structures 230A and 230B.

In the example of FIG. 2, primary stiffening structures 230A and 230B form beams that are oriented along two primary axes of rotation of micromirror 200 while secondary stiffening structures 240A to 240D run parallel and perpendicular to the two primary axes of rotation of micromirror 200. FIG. 2 is merely an example, however, and in other embodiments, stiffening structures may not run parallel and/or perpendicular to the two primary axis of the micromirror. Note that a grid structure of micromirror 200 is substantially consistent across micromirror 200. In other examples, e.g., FIGS. 3 and 4, a grid structure may vary as a function of position across the micromirror (or area of a support platform of the micromirror).

Figure 3:
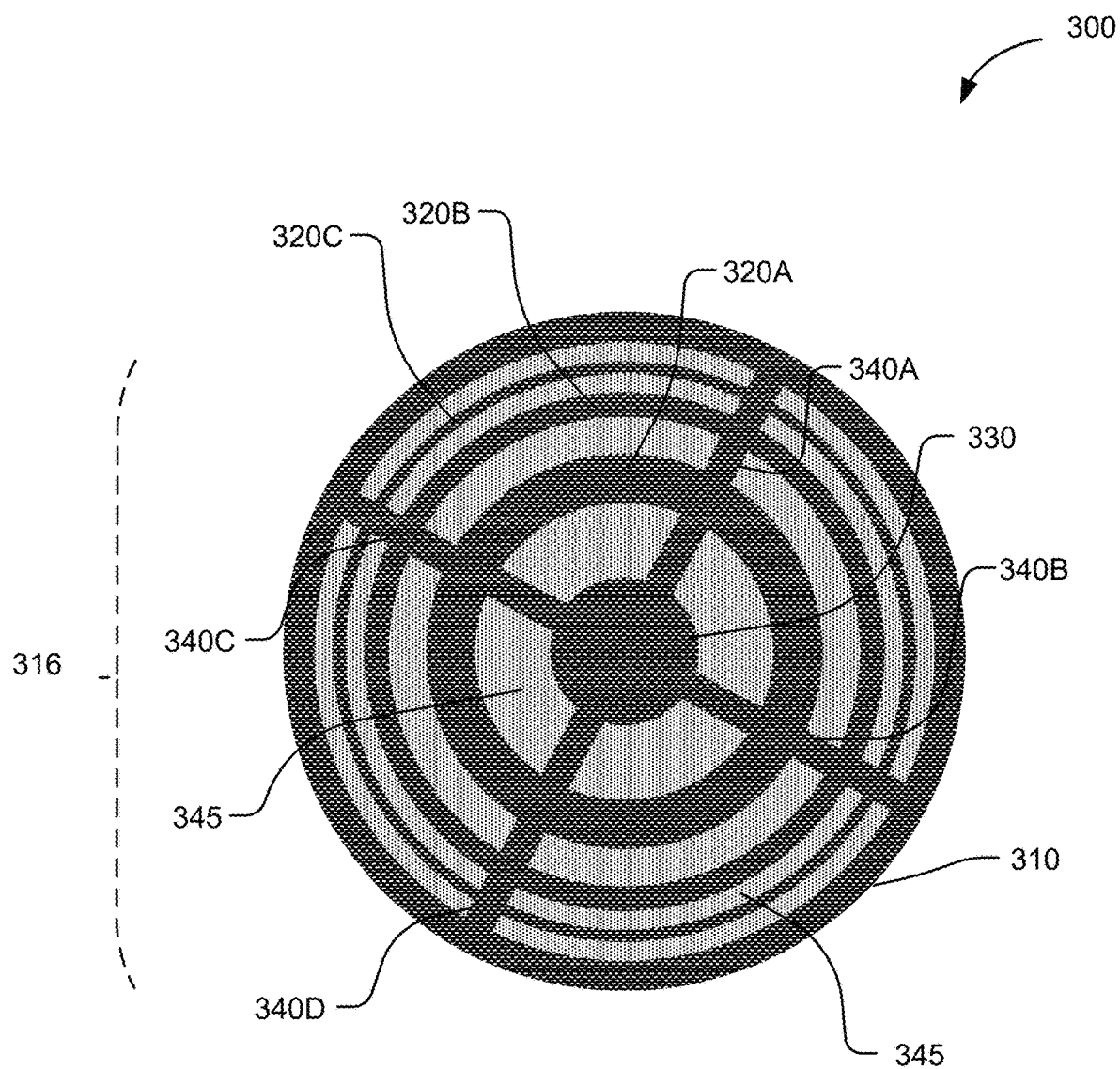
FIG. 3 illustrates a bottom view of a circular micromirror including a plurality of stiffening structures, in accordance with aspects of the disclosure.

FIG. 3 illustrates a bottom view of a circular micromirror 300 including a plurality of stiffening structures, in accordance with aspects of the disclosure. In the example of FIG. 3, a density of stiffening structures (e.g., 320A-320C) in the plurality increases as the positions of the stiffening structures move radially outward in an area 316 of a support platform beneath a mirror surface of micromirror 300. In embodiments, the plurality of stiffening structures extends down from the support platform to achieve a desired height (further shown and discussed in connection with FIG. 5). Note that although micromirror 300 is circular, elliptical, or other shapes (e.g., square of FIGS. 2 and 4) that are conducive to reflecting light from the micromirror are also contemplated.

In the example of FIG. 3, the plurality of stiffening structures includes four primary support structures 340A-340D which extend outward from a central support disk 330. The plurality of stiffening structures also includes a secondary support structure 310 that follows a perimeter of micromirror 300 and tertiary support structures 320A-320C. In aspects, tertiary support structures 320A-320C are concentric and decrease in thickness as their positions move radially outward from a center of circular micromirror 300. In aspects, regions or open areas 345 of micromirror 300 do not include stiffening structures. In the example, open areas 345 decrease in size as their positions move radially outward from a center of a circular or elliptical shape (not shown). Note that in other examples, rather than increasing, a density of the stiffening structures may decrease as their position moves outward from the center. In aspects, a dimensionality and density of the plurality of stiffening structures varies as a function of radial position across an area of the support platform of micromirror 300.

In some embodiments, the stiffening structures, e.g., 340A-340D, that extend radially outward from a center of the MEMS micromirror may be radially offset from one or more axes of rotation of micromirror 300. In such embodiments, the stiffening structures may be non-contiguous and form separate segments across the MEMS micromirror. In various embodiments, the dimensionality and density of the stiffening structures varies periodically with radial position across the area of the support platform or mirror surface.

In the example of FIG. 3, primary stiffening structures 340A-340D have an angular offset from a vertical and horizontal axis of micromirror 300. It is understood that the angular offset of micromirror 300 is merely an example and the angle may vary depending on a spacing and dimensionality of the plurality of stiffening structures.

Figure 4:
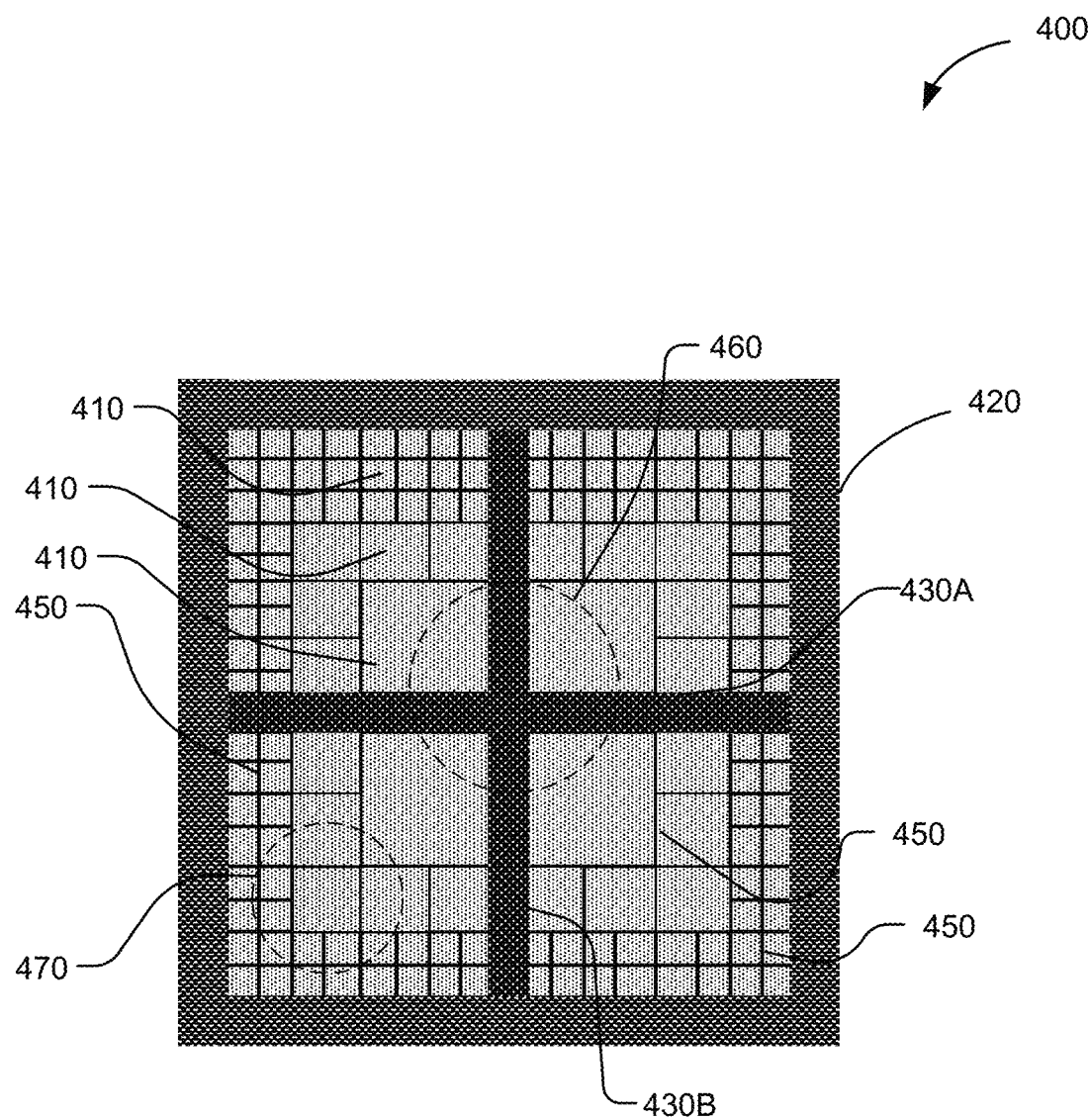
FIG. 4 illustrates a bottom view of another micromirror including a plurality of stiffening structures, in accordance with aspects of the disclosure.

FIG. 4 illustrates a bottom view of another square micromirror including a plurality of stiffening structures, in accordance with aspects of the disclosure. In FIG. 4, micromirror 400 is a square and a plurality of stiffening structures form a grid structure where a density of the plurality stiffening structures increases towards an outer portion of an area of a support platform of micromirror 400. As shown, two primary stiffening structures 430A and 430B form beams that are perpendicular to each other and run parallel along or perpendicular to two primary axes of rotations of micromirror 400. In aspects, a perimeter stiffening structure 420 follows an outer border of micromirror 400.

Note that, similar to other embodiments described herein, stiffening structures 420 to 450 extend down from a surface area of micromirror 400 and/or its support platform to achieve a desired height. In aspects, the desired height correlates to achieving a reduction in the micromirror of mass, dynamic distortions, torque, stress, or a combination thereof. Furthermore, note that perimeter stiffening structure 420 is merely an example, and perimeter stiffening structures may vary in shape, thickness, width. For example, in some aspects, perimeter stiffening structures may cover a significant percentage of the mirror surface, from e.g., 30% to 99% of the mirror surface. In other examples, perimeter stiffening structures may cover as little as 1% of the mirror surface.

Open areas 410 (only a few are labeled in FIG. 4) include regions of micromirror 400 without stiffening structures. Note that a size of open areas 410 decreases as their positions move radially outward from a center of micromirror 400. Accordingly, a number of stiffening structures in an outer area (e.g., 470) is relatively dense compared to a more central area (e.g., 460). Note that in some aspects, stiffening structure density and or dimensionality may change near a region of the micromirror that is in contact with structures holding the micromirror (not shown).

As shown above in FIGS. 2-4, the plurality of stiffening structures may form a grid. In various aspects, smaller scale structures may be inset with larger scale structures having (e.g., smaller grids inset within larger grids of e.g., micromirrors 200 and 400 of FIGS. 2 and 4). The smaller scale structures may have their own distinct dimensionality as compared to the larger scale structures. Note that a grid including the stiffening structures may be structured in various manners, such as rectilinear, skewed, curvilinear, hexagonal, diamond, radial, and/or circular (e.g., FIG. 3).

Figure 5:
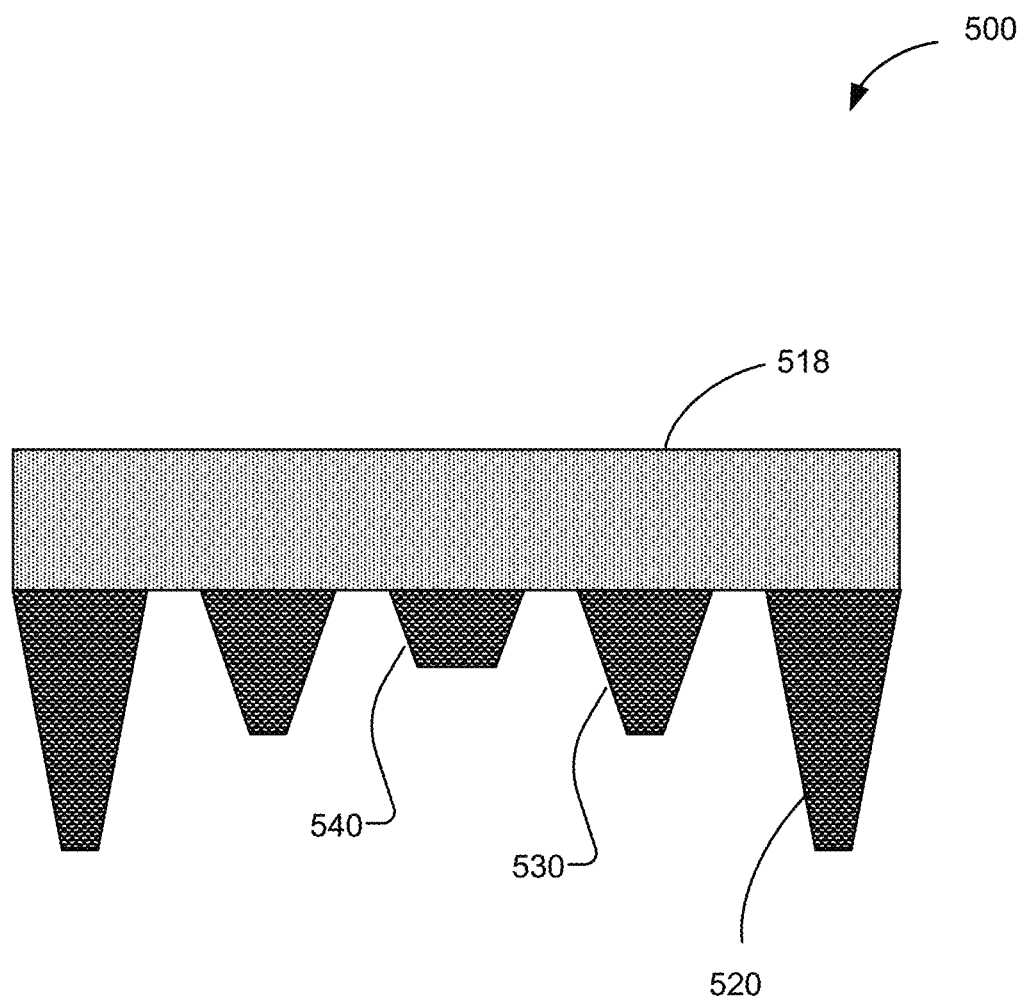
FIG. 5 is a side view of a micromirror illustrating varying heights of each of a plurality of stiffening structures, in accordance with aspects of the disclosure.

FIG. 5 is a side view of a micromirror 500 illustrating varying heights of each of a plurality of stiffening structures, in accordance with aspects of the disclosure. As shown, a plurality of stiffening structures includes a central stiffening structure 540, secondary stiffening structure 530, and a perimeter stiffening structure 520 coupled to a mirror element 518. In the example, secondary stiffening structures 530 are located between a center and perimeter of micromirror 500. In FIG. 5, a height of the stiffening structures increases as their positions move radially outward from the center of micromirror 500. In aspects, variation in height of the stiffening structures follows a linear profile and may be tapered radially from center to edge. Note, however, that any suitable height pattern (e.g., discontinuous) or profile (e.g., non-linear) that is suitable for providing support for a mirror surface while reducing torsional force is contemplated. Similarly, the cone shape of stiffening structures 520-540 are merely examples. Other suitable shapes (e.g., rectangular, scalloped, etc.) suitable for providing support for the mirror surface while reducing mass are also contemplated. Furthermore, note that in the present example, for stiffening structures 520 to 540, sidewalls are tapered at an angle that is not orthogonal to a surface area of a mirror element (or support platform) of micromirror 500. In other examples, the sidewalls may be orthogonal.

In various aspects, a method of forming the example MEMS micromirrors of FIGS. 1-4 may include forming a support platform or substrate and forming a reflective layer over a first surface of the support substrate. In various embodiments, the stiffening structures may be located on either a top or bottom surface of the micromirror. In aspects, the stiffening structures (and/or support platform) may be fabricated using standard micro-fabrication techniques, including but not limited to, lithography, etching, ion-implantation induced layer transfer, and thin film deposition. The stiffening structures and/or support platform may be made from materials including but not limited to, for example, silicon, silicon nitride, silicon oxide, or silicon carbide. When patterned on the micromirror, the aspect ratios of the stiffening structures may vary widely, e.g., from 1:1 to 1:1000, or 5:1 to 20:1, or other suitable ratio to help reduce mass, dynamic distortions, torque, stress, or a combination thereof.

Note that in the examples of FIGS. 1-4, the support platform or substrate appears to include only a single layer, however, in other aspects the support substrate may include multiple sublayers that have different mechanical properties from a mirror surface. Furthermore, as noted previously, although the example micromirrors of FIGS. 2-4 are square or circular in shape, it is understood that other shapes are contemplated such as, rectangular, elliptical, or other shapes that are conducive to reflecting light from the micromirror.

Figure 6:
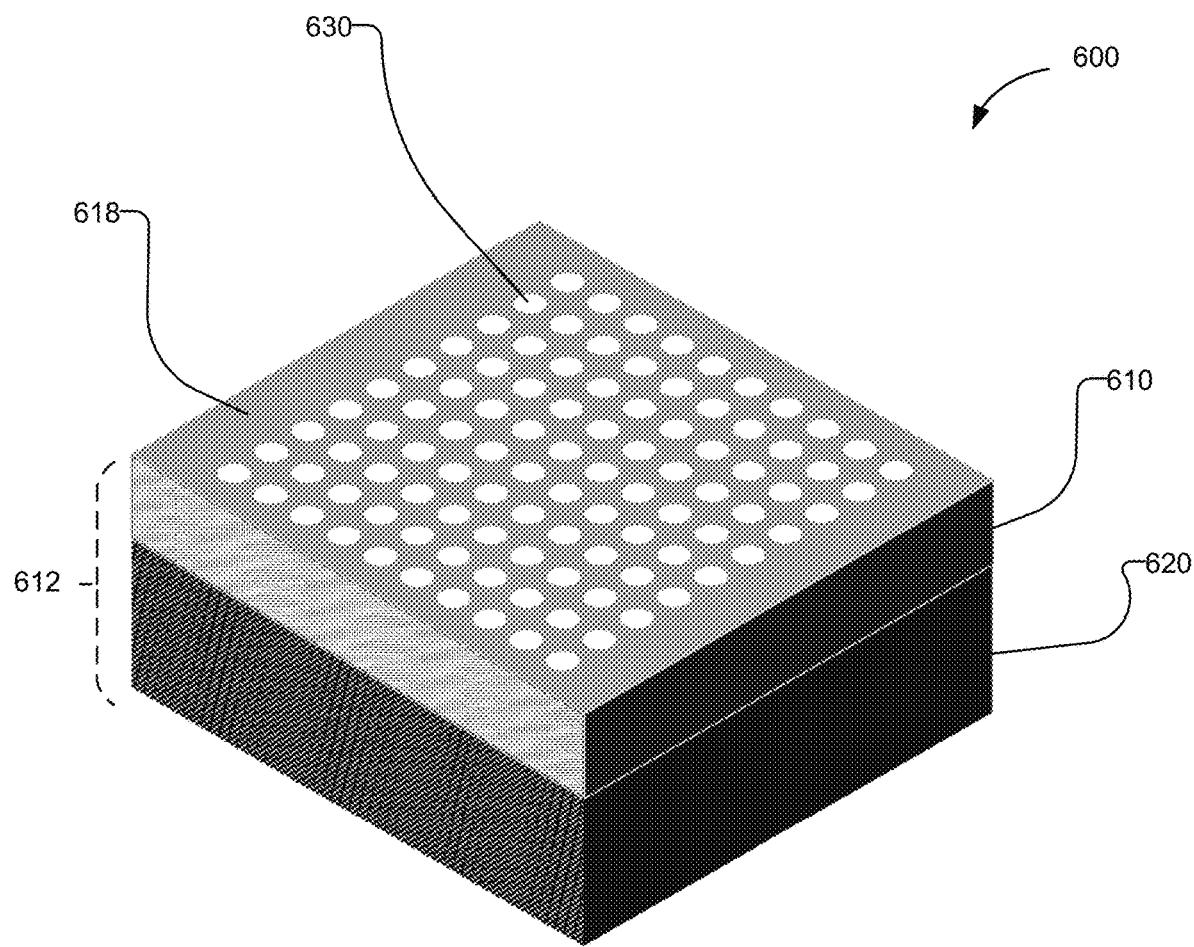
FIG. 6 illustrates a micromirror including a plurality of holes extending through a reflective layer and a thickness of a support substrate, in accordance with aspects of the disclosure.

FIG. 6 illustrates a micromirror 600 including a plurality of stiffening structures, in accordance with aspects of the disclosure. In the example of FIG. 6, mirror element 610 is located above a plurality of stiffening structures 620 and includes openings, e.g., holes 630. Holes 630 may form a pattern of openings between stiffening structures 620 and may extend completely through a reflective layer 618 and a thickness of a support substrate 612 of mirror element 610. In aspects, a size, shape, and spacing of holes 630 are designed to reduce reflections from diffracted light while reducing mass, dynamic distortions, torque, stress, or a combination thereof. In some aspects, a hole pitch is between 500 nm and 10 um and in various examples, a size of a hole 630 is fifty percent or less of the hole pitch Note that mechanical properties of micromirror 600 may be modified as a result of holes 630. Note that in some embodiments, holes 630 do not have material filling them, while in others each of holes 630 may be partially or completely filled with a secondary material. In aspects, the secondary material may include a metal, oxide, nitride, or other appropriate material. In various aspects, the secondary material is a combination of more than one material. It is understood that holes 630 are arranged in a pattern that is merely an example and that other suitable patterns which in combination with a size of holes 630 may not disturb an image formed from reflections of optical beams are contemplated. In some embodiments, the pattern formed in mirror element 610 is unrelated to a pattern formed by the plurality of stiffening structures located beneath or coupled to mirror element 610. In some aspects, holes 630 are formed to remove mass from micromirror 600 in order to offset the increased mass of the plurality of stiffening structures.

Figure 7:
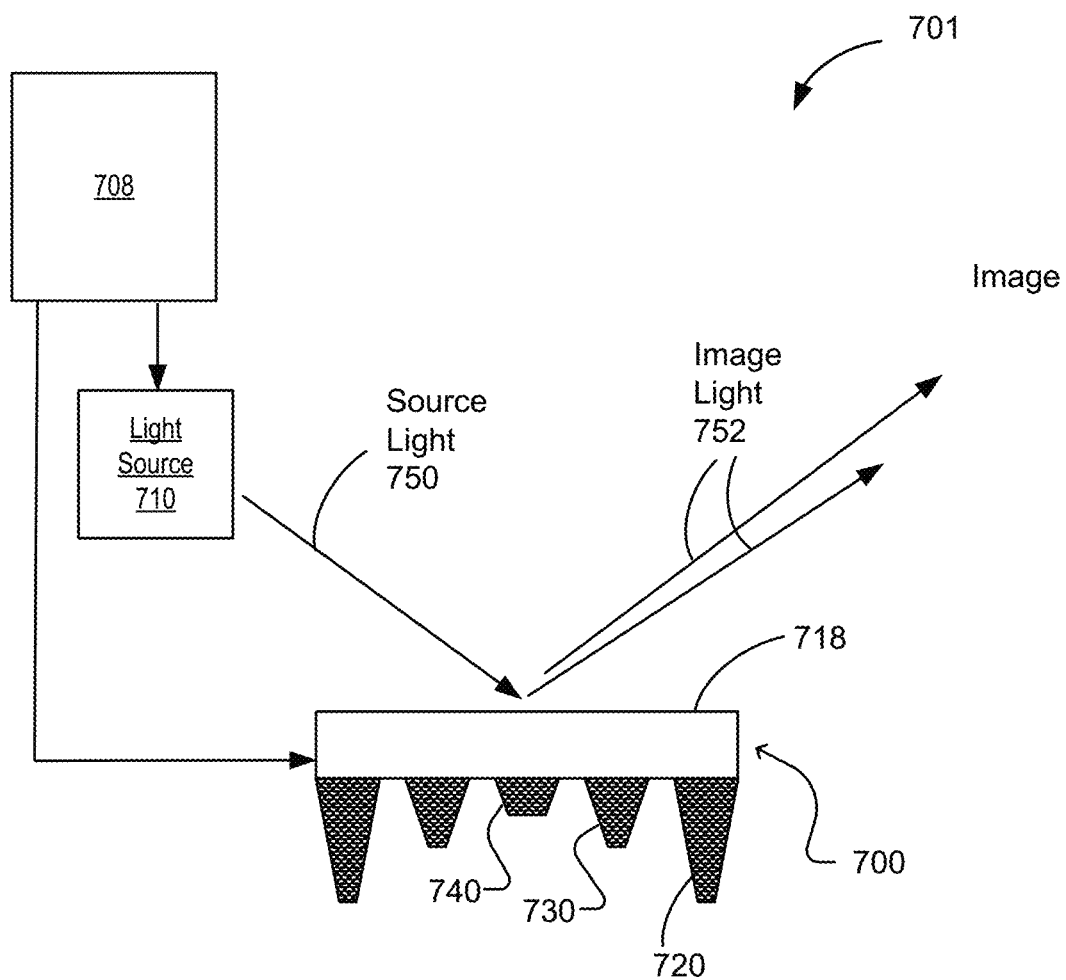
FIG. 7 is a side view of a micromirror device including a plurality of stiffening structures, in accordance with aspects of the disclosure.

FIG. 7 illustrates a side view of a MEMS micromirror device 701 including a plurality of stiffening structures, in accordance with aspects of the disclosure. MEMS micromirror device 701 includes a processing logic 708, a light source 710, and a MEMS micromirror 700. In aspects, MEMS micromirror 700 is a MEMS micromirror similar to or the same as the example MEMS micromirrors of FIGS. 1-6. For example, MEMS micromirror 700 may be similar to the MEMS mirror 100 of FIG. 1 including a plurality of layers including a reflective layer 118A in mirror element 118. In FIG. 7, MEMS micromirror 700 includes a plurality of stiffening structures 720, 730, and 740 (similar to, e.g., elements 520, 530, and 540 of FIG. 5) which have a dimensionality or density which scales across an area of a mirror surface in a manner to assist in keeping the mirror surface flat under torsional force as light is reflected from a mirror surface.

For example, as shown in FIG. 7, MEMS micromirror 700 includes a mirror surface 718 to receive source light 750 that is emitted from light source 710. In aspects, processing logic 708 is configured to drive light source 710 to emit the source light 750 and to drive MEMS micromirror 700 to rotate about at least one axis to redirect source light 750 as image light 752 to form an image. In embodiments, MEMS micromirror 700 includes a plurality of stiffening structures (e.g., as shown and discussed with respect to FIGS. 1-6) having a dimensionality or density which scales across an area of the mirror surface to assist in keeping the mirror surface flat under torsional force about the at least one axis. In some embodiments, MEMS micromirror device 701 is an optical scanner.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term "processing logic" (e.g., 708 of FIG. 7) in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A micro-electromechanical system (MEMS) micromirror, comprising:
   a mirror surface to reflect light;
   a support platform coupled along the mirror surface; and
   a plurality of stiffening structures formed from or coupled to the support platform, wherein a relative density of the stiffening structures scales inversely with a height of the stiffening structures as their positions move outward across an area of the support platform in a manner to assist in keeping the mirror surface flat under torsional force.

2. The MEMS micromirror of claim 1, wherein in addition to the height of the stiffening structures, a dimensionality includes a shape, thickness, or size of each of the plurality of stiffening structures and one or more additional dimensionalities scale hierarchically relative to the density of the stiffening structures.

3. The MEMS micromirror of claim 1, wherein the stiffening structures extend radially outward from a center of the MEMS micromirror.

4. The MEMS micromirror of claim 3, wherein the stiffening structures are radially offset from an axis of rotation of the MEMS micromirror.

5. The MEMS micromirror of claim 1, wherein each of the plurality of stiffening structures include a height that extends in a perpendicular manner from the support platform and the height varies according to a position or spacing of the stiffening structures.

6. The MEMS micromirror of claim 1, wherein the plurality of stiffening structures forms a grid structure and a density of the plurality of stiffening structures increases radially towards an outer portion of the support platform.

7. The MEMS micromirror of claim 1, wherein the mirror surface comprises a reflective layer and wherein a portion of the reflective layer and the support platform form a mirror element.

8. The MEMS micromirror of claim 7, wherein the mirror element includes a plurality of holes extending through the reflective layer and through a thickness of the support substrate.

9. A method of forming a micro-electro-mechanical system (MEMS) micromirror, comprising:
   forming a support substrate; and
   forming a reflective layer over a first surface of the support substrate, wherein the support substrate is formed to include a plurality of stiffening structures on a second surface that is opposite the first surface and wherein a relative density of the plurality of stiffening structures scales inversely with a height of the stiffening structures as their positions move outward across an area of the second surface to assist in keeping the reflective layer optically flat under torsional force.

10. The method of claim 9, wherein in addition to the height of the stiffening structures, one or more additional dimensionalities of the plurality of stiffening structures scales hierarchically relative to the density of the stiffening structures.

11. The method of claim 10, wherein a size or thickness of each of the plurality of stiffening structures decreases as their positions move radially outward in an area of the support substrate.

12. The method of claim 10, wherein each of the plurality of stiffening structures have a height that extends in a perpendicular manner from the second surface and the height varies according to a position or spacing of the stiffening structures.

13. The method of claim 9, wherein forming the support substrate includes forming the support substrate from at least one of silicon, silicon nitride, silicon oxide or silicon carbide.

14. The method of claim 9, wherein the plurality of stiffening structures forms concentric circles or ellipses across an area of the support substrate.

15. An optical scanner comprising:
   a light source configured to emit source light;
   a micro-electromechanical system (MEMS) micromirror including a mirror surface to receive the source light; and
   processing logic configured to:
      drive the light source to emit the source light; and drive the MEMS micromirror to rotate about at least one axis to redirect the source light as image light to form an image, wherein the MEMS micromirror includes a plurality of stiffening structures having a density which scales inversely with a height of the stiffening structures across an area of the mirror surface to assist in keeping the mirror surface flat under torsional force about the at least one axis.

16. The optical scanner of claim 15, wherein the density of stiffening structures in the plurality increases as their positions move radially outward in an area of a support substrate coupled to the mirror surface.

17. The optical scanner of claim 15, wherein a first dimensionality including the height and a second dimensionality of the plurality of stiffening structures scales hierarchically relative to the density of the plurality of stiffening structures.

18. The optical scanner of claim 15, wherein the plurality of stiffening structures form a grid across an area of the support substrate.

* * * * *